United States Patent
Youker et al.

(10) Patent No.: US 6,288,344 B1
(45) Date of Patent: Sep. 11, 2001

(54) INTEGRATED EMI SHIELD UTILIZING A HYBRID EDGE

(75) Inventors: Nick A. Youker, Fridley; James E. Blood, Brooklyn Park; John E. Hansen, Coon Rapids, all of MN (US)

(73) Assignee: Cardiac Pacemakers, Inc., St. Paul, MN (US)

( * ) Notice: Subject to any disclaimer, the term of this patent is extended or adjusted under 35 U.S.C. 154(b) by 0 days.

(21) Appl. No.: 09/378,407

(22) Filed: Aug. 20, 1999

(51) Int. Cl.[7] .............................. H05K 1/03; H05K 1/16; H05K 7/02
(52) U.S. Cl. .................. 174/255; 174/250; 174/260; 361/760; 361/783; 361/799; 361/800; 257/707
(58) Field of Search ................... 174/250, 255, 174/256, 254, 258, 36, 251, 260; 361/783, 760, 792, 793, 794, 795, 799, 800; 257/707, 692, 779, 778, 736

(56) References Cited

U.S. PATENT DOCUMENTS

| | | | |
|---|---|---|---|
| 4,024,629 | 5/1977 | Lemoine et al. | 29/625 |
| 4,665,468 * | 5/1987 | Dohya | 361/414 |
| 4,754,101 * | 6/1988 | Stickney et al. | 174/35 |
| 4,764,233 * | 8/1988 | Ogihara et al. | 156/89 |
| 4,916,261 * | 4/1990 | Thanh et al. | 174/255 |
| 5,014,160 * | 5/1991 | McCoy, Jr. | 361/818 |
| 5,027,191 | 6/1991 | Bourdelaise et al. | 357/74 |
| 5,043,848 * | 8/1991 | Rogers et al. | 361/816 |
| 5,086,334 | 2/1992 | Eberlein | 357/70 |
| 5,119,047 * | 6/1992 | Brown et al. | 333/12 |
| 5,151,770 | 9/1992 | Inoue | 357/53 |
| 5,166,772 | 11/1992 | Soldner et al. | 257/659 |
| 5,225,709 | 7/1993 | Nishiuma et al. | 257/700 |
| 5,256,590 | 10/1993 | Inoue | 437/61 |
| 5,282,312 | 2/1994 | DiStefano et al. | 29/830 |
| 5,294,751 | 3/1994 | Kamada | 174/52.4 |
| 5,329,695 * | 7/1994 | Traskos et al. | 29/830 |
| 5,333,100 * | 7/1994 | Anhalt et al. | 361/818 |
| 5,352,925 * | 10/1994 | Sudoh et al. | 257/659 |
| 5,355,016 | 10/1994 | Swirbel et al. | 257/659 |
| 5,357,404 | 10/1994 | Bright et al. | 361/818 |
| 5,371,404 | 12/1994 | Juskey et al. | 257/659 |
| 5,376,759 * | 12/1994 | Marx et al. | 174/255 |
| 5,483,414 * | 1/1996 | Babb | 361/220 |
| 5,491,301 | 2/1996 | Akiba et al. | 174/250 |
| 5,519,176 * | 5/1996 | Goodman et al. | 174/255 |
| 5,557,142 | 9/1996 | Gilmore et al. | 257/659 |
| 5,586,011 | 12/1996 | Alexander | 361/818 |
| 5,596,229 | 1/1997 | Simon | 257/727 |
| 5,825,632 * | 10/1998 | Tanei et al. | 361/795 |
| 5,831,324 | 11/1998 | Bang | 257/508 |
| 5,861,670 | 1/1999 | Akasaki | 257/7.37 |
| 5,866,943 | 2/1999 | Mertol | 257/712 |
| 5,889,322 | 3/1999 | Hamada et al. | 257/701 |
| 5,917,708 | 6/1999 | Moran et al. | 361/800 |
| 5,929,375 | 7/1999 | Glovatsky et al. | 174/35 R |
| 5,966,294 * | 10/1999 | Harada et al. | 361/794 |
| 6,122,178 * | 9/2000 | Andrews et al. | 361/800 |

* cited by examiner

Primary Examiner—Jeffrey Gaffin
Assistant Examiner—J B Patel
(74) Attorney, Agent, or Firm—Schwegman, Lundberg, Woessner & Kluth, P.A.

(57) ABSTRACT

The present embodiments and associated methods provide for an integrated EMI shield for effective shielding not only from emissions perpendicular to the integrated circuit (IC) chip carrier but also parallel (edgewise) to the carrier. In one embodiment, an IC chip carrier comprises an insulating ceramic substrate and at least one internal electrically conductive layer being a circuit ground, portions of which extend to the edge of the substrate, the internal electrically conductive layer in electrical contact with an electrically conductive layer applied to a portion of the substrate edge. This provides a horizontal hybrid ground plane which can be used as an EMI shield that runs horizontally to the chip as well as a hybrid edge EMI shield perpendicular along at least a portion of the edge. This edge shield protects internal circuitry from exterior EMI emissions directed towards the chip carrier edge portion incorporating the shield.

19 Claims, 7 Drawing Sheets

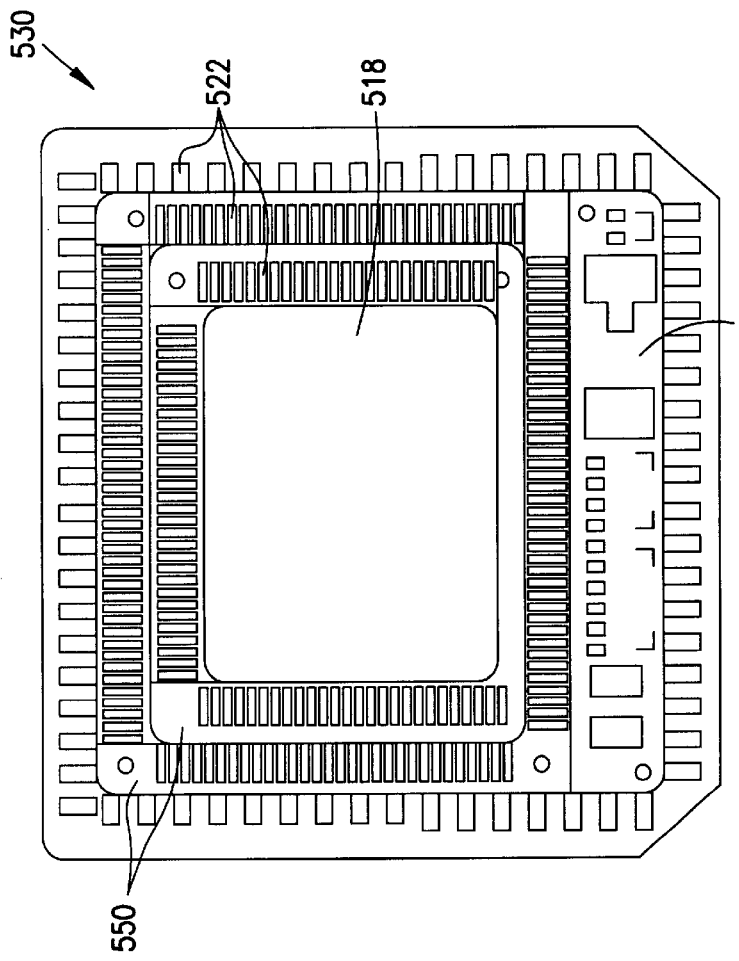
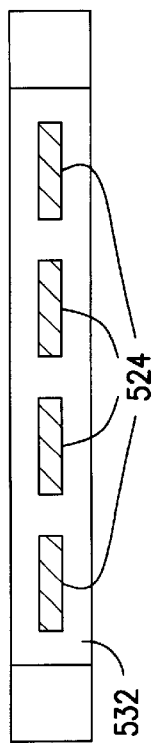
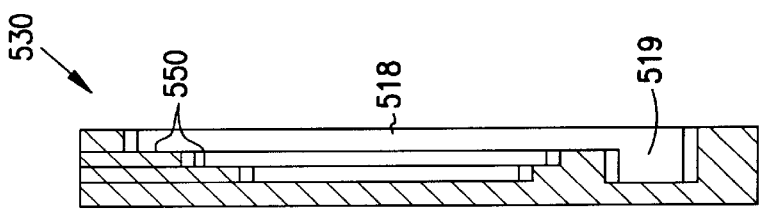
FIG. 5A
FIG. 5B
FIG. 5C

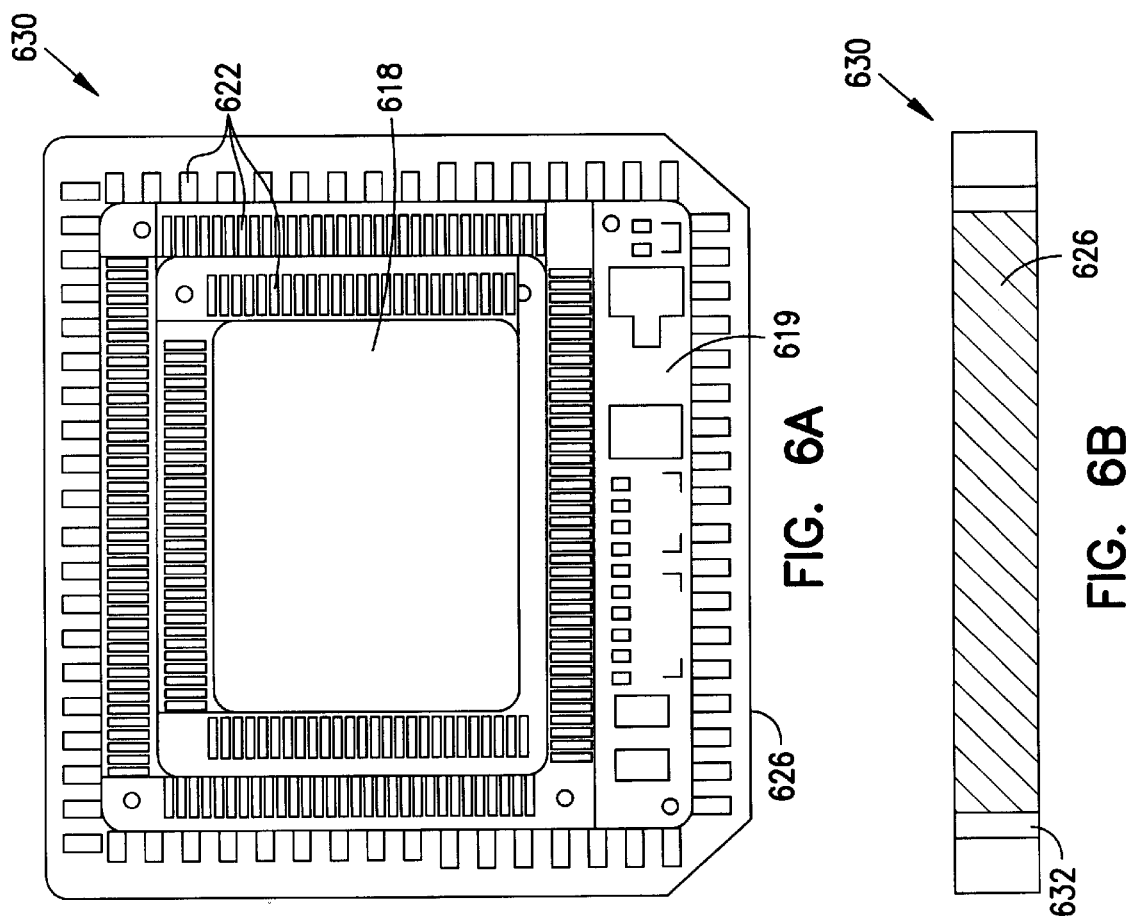

INTEGRATED EMI SHIELD UTILIZING A HYBRID EDGE

TECHNICAL FIELD

The present description generally relates to hybrid circuit boards, and more particularly to edgewise electromagnetic interference (EMI) shielding utilizing an integrated peripheral EMI shield.

BACKGROUND

In many applications, sensitive electronic circuitry and components are susceptible to electromagnetic interference (EMI) emanating from other circuits and components. Electronics designers may incorporate EMI shields to isolate the sensitive circuits from the offending circuits. For example, in the design of implantable cardioverter defibrillators, highly sensitive circuitry is in very close proximity to the pulse generating case which is a major EMI source. Such shielding may be composed of electrically conductive metal, such as copper, and may be in electrical contact with electrical ground.

Integrated circuit (IC) chip carriers are specialized circuit panel structures that are frequently used to attach IC's to circuit boards. Chip carriers provide high density, complex interconnections between the IC and the circuit board. Separately attached peripheral or edge shielding is used to address cross-wise EMI emissions. Such shielding may be in the form of conductive tape or foil. The physical size of the tape is a limiting factor for miniaturizing systems and the extra labor involved in manufacturing does not provide for an efficient manufacturing process. It is not mechanically efficient or desirable to have a separate component that takes up valuable device space and volume.

SUMMARY

The present embodiments and associated methods provide for an integrated EMI shield for effective shielding not only from emissions perpendicular to the integrated circuit (IC) chip carrier but also parallel (edgewise) to the carrier. In one embodiment, an IC chip carrier comprises an insulating ceramic substrate and at least one internal electrically conductive layer being a circuit ground, portions of which extend to the edge of the substrate, the internal electrically conductive layer in electrical contact with an electrically conductive layer applied to a portion of the substrate edge. This provides a horizontal hybrid ground plane which can be used as an EMI shield that runs horizontally to the chip as well as a hybrid edge EMI shield perpendicular along a portion of the edge. This edge shield protects internal circuitry from exterior EMI emissions directed towards the chip carrier edge portion incorporating the shield.

In one embodiment, the method of applying the edge conductive layer comprises the steps of laying-up a plurality of ceramic green sheets, at least one green sheet having an applied electrically conductive first layer, applying heat and pressure to the lay-up to consolidate the green sheets and at least one conductive layer into a monolithic structure, exposing at least a portion of the conductive layer on the structure edge, application of metallized paste (such as that used to create the first conductive layer) to at least a portion of the structure edge and in electrical contact with the first conductive layer, applying heat and pressure to the structure a second time to metalize the paste and to create a consolidated chip carrier.

In another embodiment, metalized paste is applied to the entire chip carrier edge and in electrical contact with the first conductive layer. The chip carrier is treated to heat and pressure a second time to consolidate the unit. Thus, the chip carrier has a hybrid shield which provides EMI shielding of internal circuits from external EMI emissions directed towards any part of the edge of the chip carrier.

In another embodiment, the metalized paste is applied using a printing process, such as silk-screening.

In another embodiment, the metalized paste contains molybdenum.

In another embodiment, the metalized paste contains tungsten.

In another embodiment, the edge EMI shield is applied via a plating process not requiring a second heat and pressure treatment.

In other embodiments, where the chip carrier is made of a low-temperature calcined ceramic, the metalized paste may contain either Cu, Au, Ag, Al, Ni, Pb-Sn, among others, since the heat treatments may be conducted at a lower temperature.

In another embodiment, the edge shield is applied to a printed circuit board.

In another embodiment, the edge shield is applied to a printed wiring board.

This summary is a brief overview of some embodiments of an integrated EMI shield utilizing a hybrid edge and methods of use and is not intended to be exclusive or limiting and the scope of the invention is provided by the attached claims and their equivalents.

BRIEF DESCRIPTION OF THE DRAWINGS

FIG. 5A is a top view of one embodiment of a chip carrier.

FIG. 5B is a side view of one embodiment of a chip carrier.

FIG. 5C is a cross section view of one embodiment of a chip carrier.

FIG. 6A is a top view of one embodiment of a chip carrier.

FIG. 6B is a side view of one embodiment of a chip carrier with an integrated EMI edge shield.

DETAILED DESCRIPTION

Figure 1:
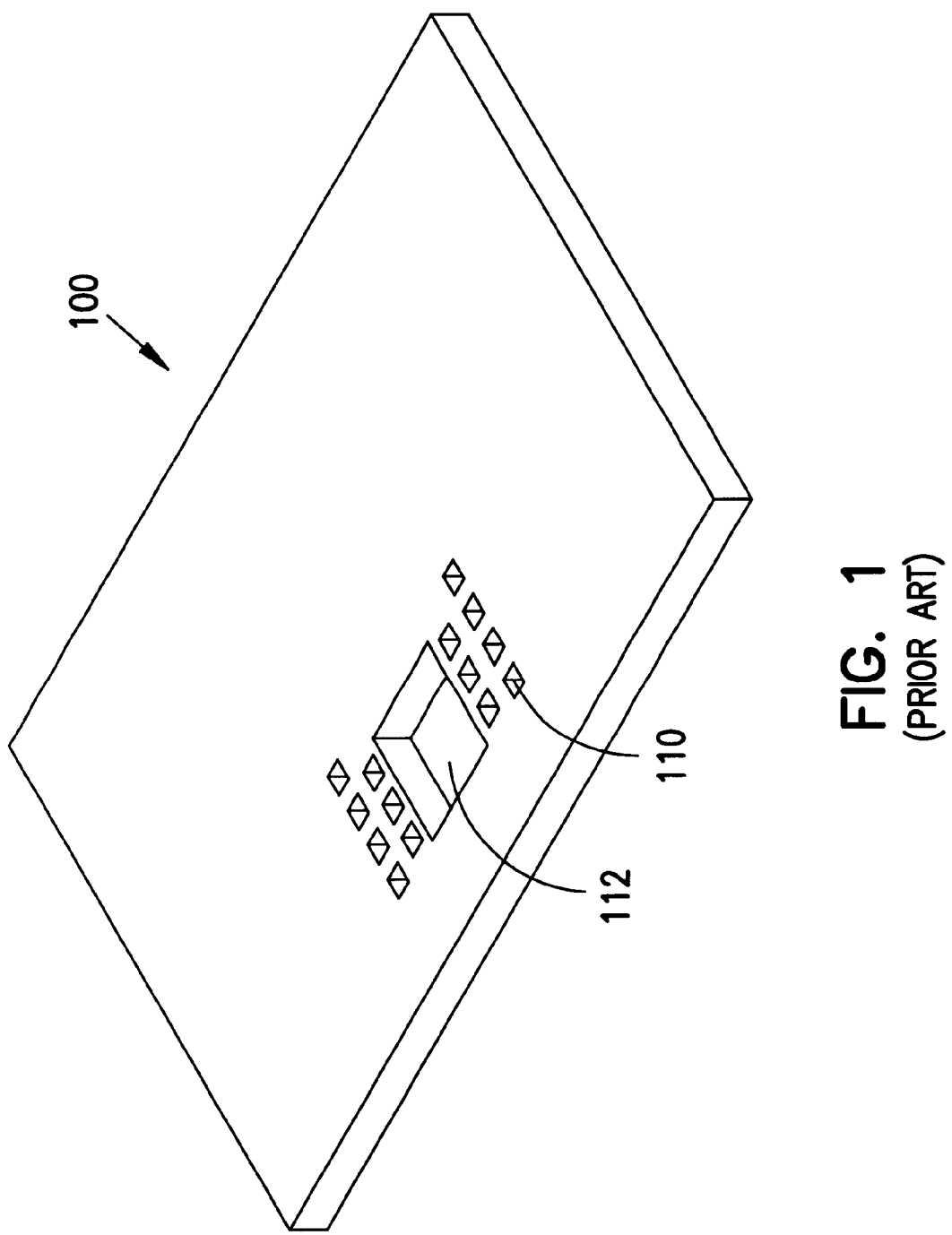
FIG. 1 is a perspective view of one embodiment of a ceramic green sheet with through-holes.

In the following detailed description, reference is made to the accompanying drawings, which are not necessarily to scale, which form a part hereof, and in which is shown by way of illustrating specific embodiments in which the device may be practiced. These embodiments are described in sufficient detail to enable those skilled in the art to practice the device, and it is to be understood that the embodiments may be combined, or that other embodiments may be utilized and that structural changes may be made without departing from the spirit and scope. The following detailed description is, therefore, not to be taken in a limiting sense, and the scope is defined by the appended claims and their equivalents. In the drawings, like numerals describe substantially similar components throughout the several views.

The present embodiments and methods will be described in applications involving ceramic IC chip carriers. However, it is understood that the present apparatus and methods may be employed in other single or multi-layer wiring board applications.

The basic components of a chip carrier is a multi-layer integrated structure of electrically insulating ceramic sheets upon which a network of electrically conductive network or "paths" are placed. The pre-fired (green) ceramic sheet is produced by casting a thin layer of ceramic material onto a flexible sheet which is allowed to dry. The ceramic material is typically alumina powder in an organic binder, solvents, plastifiers, and resins. After drying, the ceramic film is stripped from its substrate and allowed to release the volatile components. The green ceramic film is then cut into desired dimensions. Sheets may be made large enough to produce a number of chip carriers after a final cutting or sawing procedure is performed on the post-fired unit.

FIG. 1 illustrates an embodiment of a ceramic green sheet 100. Through-holes 110 are punched or cut in the green sheets 100 at predetermined locations which are subsequently filled with metalized paste to provide electric interconnections between the metallized patterns or networks which will be applied to the various green sheets 100. Additional through-holes 112 may be punched or cut into the green sheet 100 to provide what would later become a cavity into which IC chips or other circuits are placed.

Figure 2:
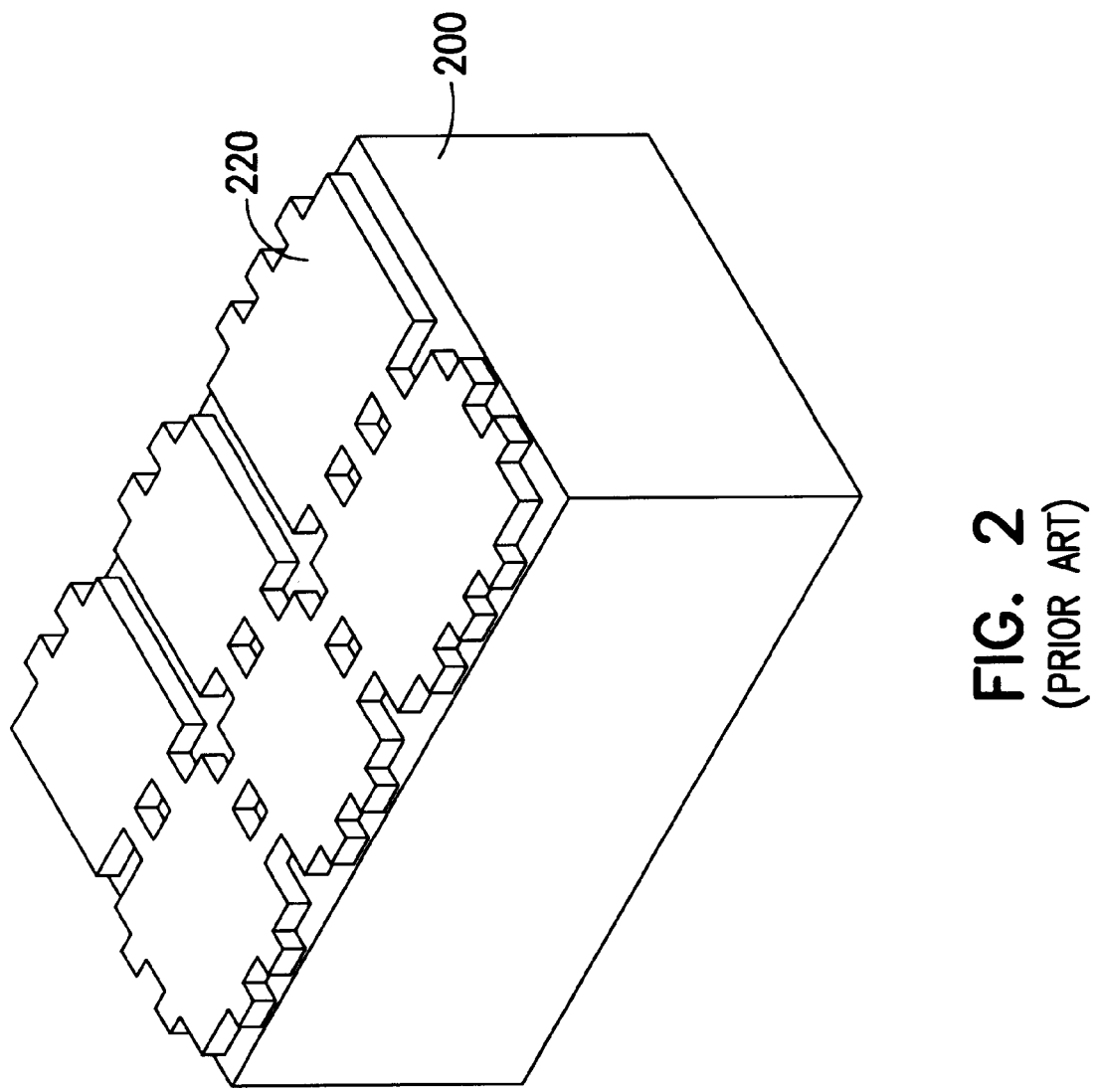
FIG. 2 is a perspective view of one embodiment of a ceramic green sheet with a layer of electrically conductive paste.

FIG. 2 illustrates a green sheet 200 with applied conductive metalized paste 220. The conductive metallized paste 220 is deposited on the green sheet 200 by printing methods such as silk-screening through a mask. The conductive paste 220 materials consist of a mixture of metal and alumina particles and a solvent/binder. The metal particles are of a refractory and/or noble metal, such as molybdenum or tungsten.

Figure 3:
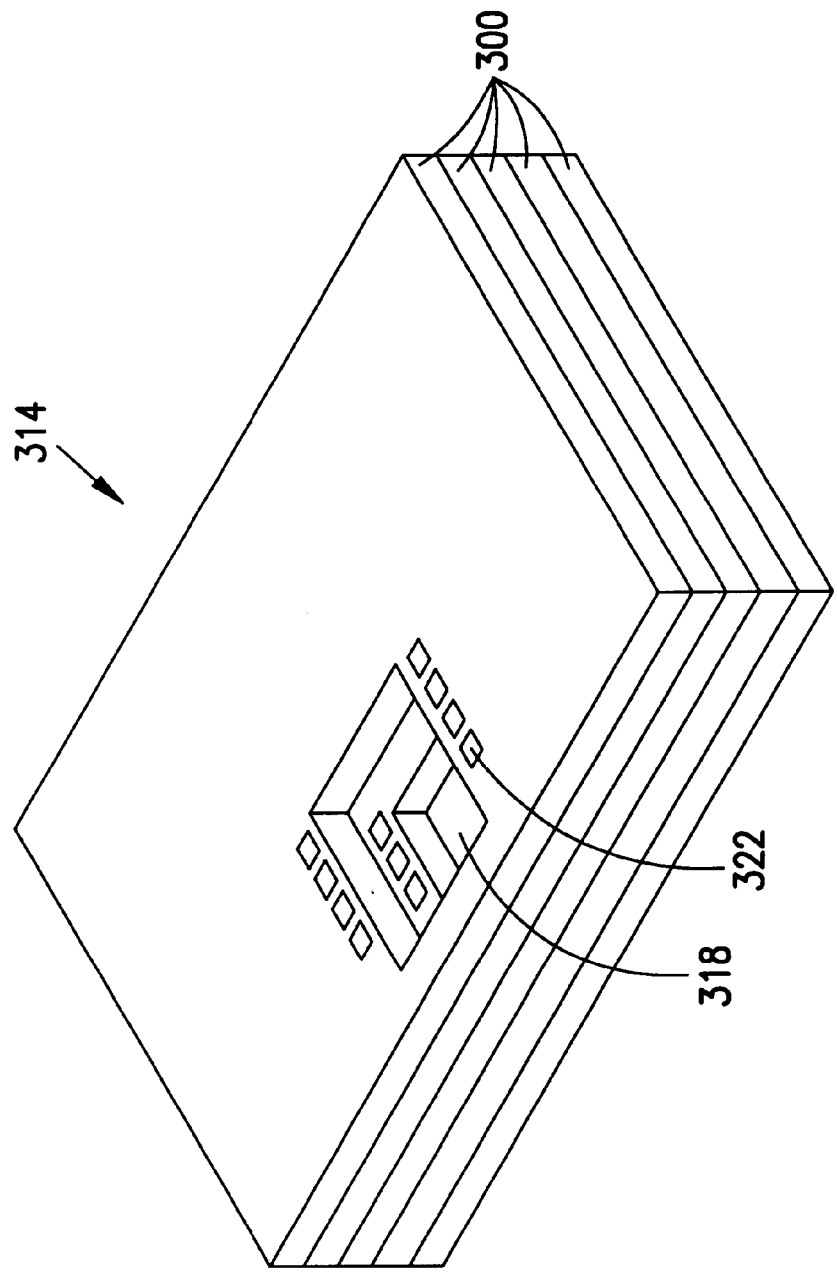
FIG. 3 is a perspective view of one embodiment of a pre-fired stack of ceramic green sheets.

FIG. 3 illustrates an embodiment of a multi-layer green sheet stack 314. Several green sheets 300 with corresponding metalized conductive paths (not shown) are stacked together in such a way as to ensure that all conductive paths are established. The stacking of non-filled through-holes provides a cavity 318 for accepting IC or other circuits. The multi-layer stack 314 is laminated at sufficient pressure and temperature to cause the binder to evaporate and provide good intersheet bonding. A monolithic structure is thus obtained which is then sintered at the temperature required to fire the ceramic, thereby eliminating the organic components of the pastes and converting the conductive metalized paste to the metal state. Exposed though-holes filled with metalized paste provide electrical attachment pads 322 for attaching IC leads.

Figure 4:
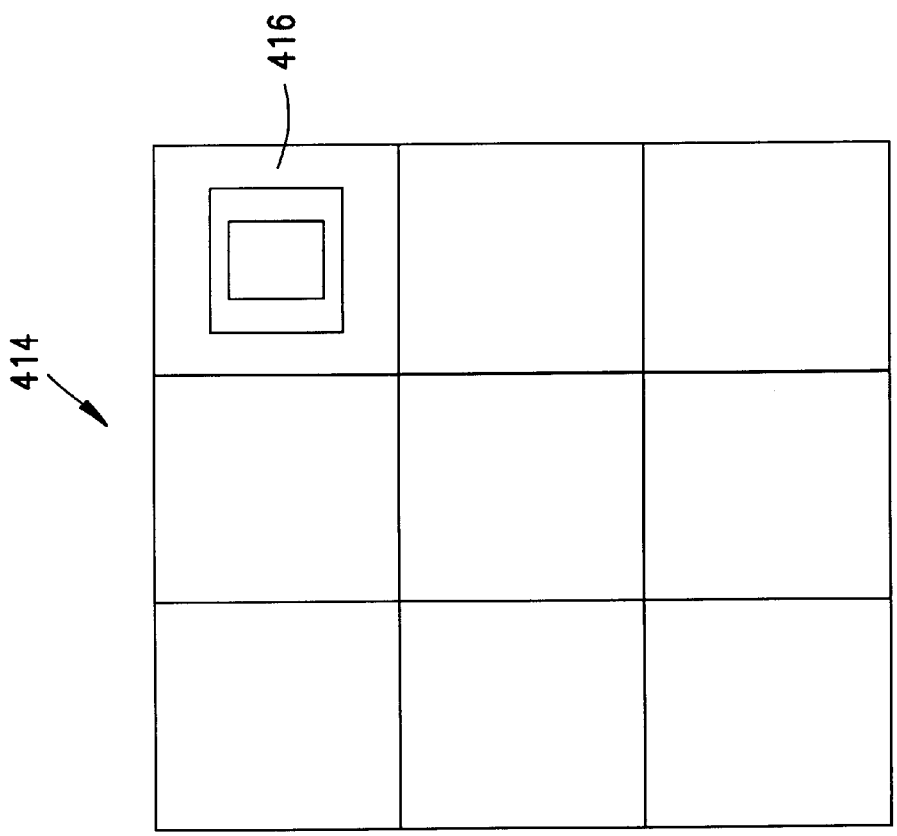
FIG. 4 is a top view of one embodiment of a post-fired pre-sawn stack of ceramic green sheets.

FIG. 4 illustrates a top view of an embodiment a post-fired pre-sawn sheet 414 of chip carriers 416. Individual chip carriers 416 are sawed or cut from this monolithic structure 414.

FIG. 5 illustrates various views of an embodiment of chip carrier 530. FIG. 5A is a top view of one embodiment of a chip carrier. IC chip carriers 530 may incorporate a cavity 518 that holds integrated circuit chips or other circuits. FIG. 5C illustrates the chip carrier 530 cross-section showing the staircase-shaped steps 550 of cavity 518. Other cavities may not have this structure as is illustrated by a second cavity 519. As shown in FIG. 5A, patterned electrical conductors terminating in bonding pads 522 lie on the surfaces of the ceramic layers and on the steps 550 of cavity 518. The bonding pads 522 on the cavity steps 550 are connected to an integrated circuit (not shown) through either bonding pads or individual wire leads on the IC to carry signals to and from the chip.

FIG. 5B shows an edge view of an embodiment of chip carrier 530 having portions of an electrically conductive layer, in this case a hybrid horizontal ground plane (HHGP) 524, exposed on the edge of the chip carrier 530. Portions of the HHGP 524 may be exposed as an engineered feature of the unit, or as a consequence of having sawed through portions of the HHGP 524 during the sawing process.

In one embodiment, metalized paste (such as that used to create the HHGP 524 itself) is applied to a portion of the edge 532 of the chip carrier 530 and in electrical contact with the HHGP 524. The chip carrier 530 is then sintered a second time to metalize the paste forming the integrated hybrid edge EMI shield and to create a consolidated unit.

FIG. 6A and 6B shows, respectively, a top and edge view of an embodiment of chip carrier 630 incorporating an integrated hybrid edge EMI shield 626. This embodiment provides an edge shield 626 that shields circuitry that is internally mounted in cavities 618 and 619 from external EMI emissions directed towards the portion of the chip carrier edge 632 incorporating the shield 626.

A subsequent manufacturing step may be used where copper is introduced to the conductive paths through capillary action to fill any voids and provide a solid conduction path. The exposed interconnect pads 622 are then plated or coated with another metal layer, preferably a noble metal such as Pt, Pd, Au, or Ag, to provide an oxide-free surface to attach IC or other component leads.

Other subsequent manufacturing steps may be performed to create the final chip carrier. In some cases, a thick-film conductor, a thick-film resistor, glass and the like, are printed and baked repetitively on one or more surfaces of the multilayered substrate.

Figure 7:
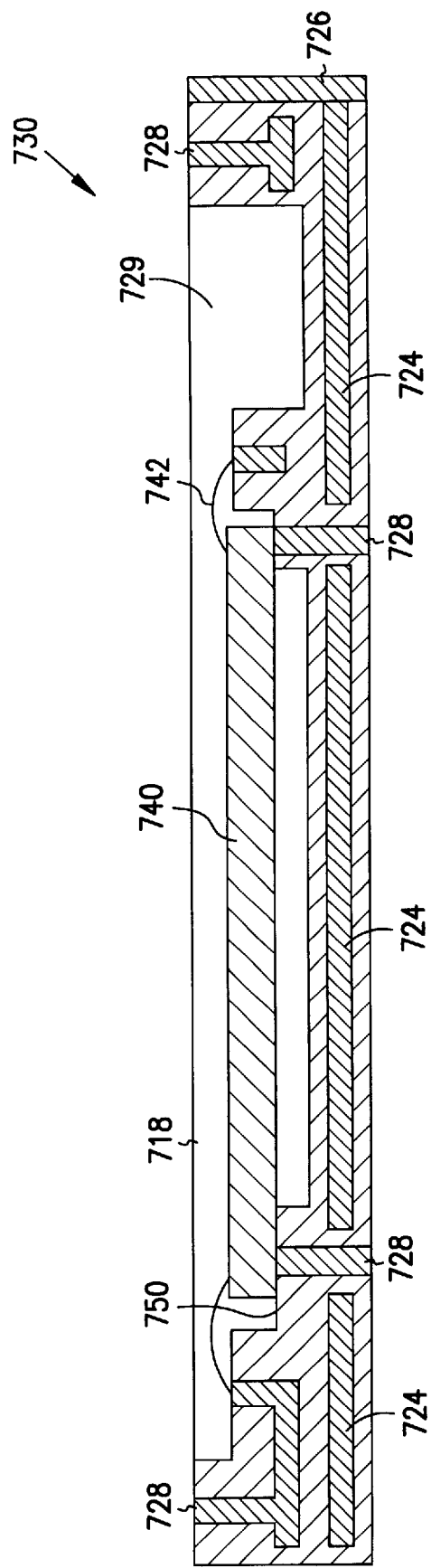
FIG. 7 is a cross sectional view of one embodiment of a chip carrier with an integrated EMI edge shield.

FIG. 7 illustrates a cross section of an embodiment of a chip carrier 730 incorporating an integrated hybrid edge EMI shield 726. The chip carrier 730 incorporates conduction paths 728 to allow electrical communication of the IC 740 to an external device, such as a circuit board (not shown). The IC 740 is in electrical communication with the conduction paths 728 through either wire bonding leads 742 or conduction pads on the IC 740 itself (not shown). The integrated hybrid edge EMI shield 726 is electrically connected with the integrated hybrid horizontal ground plane 724, both of which may act as an EMI shield. This embodiment provides an EMI shield that shields circuitry that is internally mounted in cavities 718 and 719 from external EMI emissions directed towards the portion of the chip carrier edge incorporating the shield 726 and the chip carrier side incorporating the hybrid horizontal ground plane 724.

Chip carriers made from alumina ceramic green sheets are baked at a temperature of a thousand and several hundred degrees with the application of pressure, thereby to obtain a multi-layered consolidated ceramic substrate. In order to withstand these high temperatures, the conductive paste material has to be composed of a refractory metal such as tungsten or molybdenum. In order to incorporate the integrated hybrid EMI edge shield, the edge shield must also be able to withstand these high temperatures while the chip carrier undergoes the second firing at similar temperatures. Therefore, the edge shield must also be composed of a refractory metal.

Alternatively, low calcined temperature ceramic substrate materials, such as glass or composite glass-ceramic, may be used instead of the alumina for the green sheets. This allows for the use of lower melting point metals such as Ag, Au, Ag—Pd, and Cu for the metalized layers. This would allow the EMI shield to be composed of these metals also. The preparation method is the same as that in the case of alumina.

It is to be understood that the above description is intended to be illustrative, and not restrictive. Many other embodiments will be apparent to those of skill in the art upon reviewing the above description. The scope of the invention should, therefore, be determined with reference to the appended claims, along with the full scope of equivalents to which such claims are entitled.

What is claimed is:

1. An integrated circuit chip carrier, comprising:
    an electrically insulating substrate having an edge, a first side, a second side, at least one conduction path, and one or more cavities extending from the first side, the one or more cavities adapted to at least substantially enclose one or more electrical components, the one or more cavities further comprising at least one bond pad in electrical communication with the at least one conduction path, the at least one bond pad adapted to electrically communicate with the one or more electrical components;
    at least one internal electrically conductive layer adapted to be a circuit ground, at least a portion of the at least one internal electrically conductive layer extending to the edge of the substrate; and
    a second electrically conductive layer on at least a portion of the substrate edge, the at least one internal electrically conductive layer in electrical contact with the second electrically conductive layer.

2. An integrated circuit chip carrier according to claim 1, wherein the substrate is a ceramic material.

3. An integrated circuit chip carrier according to claim 2, wherein the second electrically conductive layer is tungsten.

4. An integrated circuit chip carrier according to claim 2, wherein the second electrically conductive layer is molybdenum.

5. The chip carrier as recited in claim 1, the one or more cavities further comprising a plurality of walls, a bottom, and one or more levels defined by steps in the cavity walls.

6. The chip carrier as recited in claim 5, the one or more steps further comprising at least one bond pad in electrical communication with the at least one conduction path.

7. The chip carrier as recited in claim 6, wherein the at least one bond pad is adapted to electrically connect with a corresponding integrated circuit chip bond pad.

8. The chip carrier as recited in claim 1, further comprising one or more first side bond pads disposed on the first side, the one or more first side bond pads adapted to electrically connect with electrical component bond pads, the one or more first side bond pads adapted to electrically connect with at least one of the at least one conduction paths.

9. The chip carrier as recited in claim 1, wherein the at least one conduction path extends to the second side and is adapted to electrically communicate with an external device.

10. The chip carrier as recited in claim 1, wherein the at least one conduction path extends to the first side or the second side and is adapted to electrically communicate with an external device.

11. The chip carrier as recited in claim 1, wherein the one or more cavities completely enclose the one or more electrical components.

12. The chip carrier as recited in claim 1, wherein at least one of the one or more electrical components is an integrated circuit chip.

13. The chip carrier as recited in claim 1, wherein the substrate further comprises a plurality of layers, each layer comprising a substantially planar sheet of insulating material upon which and through which one or more conduction paths are desposed, one or more layers further comprising one or more voids, wherein the plurality of layers are adapted to be stacked and consolidated to form the substrate, the voids forming the one or more cavities, and the one or more conduction paths forming interconnecting conduction paths with the at least one bond paths.

14. The chip carrier as recited in claim 1, the one or more cavities further comprising a bottom surface and a side surface, wherein the at least one internally conductive layer substantially prevents electromagnetic emissions from passing through the bottom of at least one of the one or more cavities, and wherein the second electrically conductive layer substantially prevents electromagnetic emissions from passing through the side of at least one of the one or more cavities.

15. A circuit board comprising:
    a substrate having an edge, a top surface and a bottom surface, at least one conduction path, and one or more cavities extending from the top surface, the one or more cavities adapted to at least substantially enclose one or more electrical components, the cavities further comprising one or more bond pads to electrically connect the one or more electrical components to the at least one conduction path, the substrate comprising a thermoplastic polymeric material;
    one or more electrical components disposed substantially within the one or more cavities;
    an electrically grounded planar conductive layer substantially encapsulated by the substrate, the planar conductive layer adapted to shield the electrical components from electromagnetic interference originating from a side of the planar conductive layer opposite from the electrical components;
    a least a portion of the planar conductive layer extending outward to the edge of the substrate; and
    an edge conductive layer on at least a portion of the edge of the substrate, wherein the edge conductive layer is electrically connected to the planar conductive layer, the edge conductive layer adapted to substantially block electromagnetic interference emissions originating from a side of the edge conductive layer opposite from the electrical components.

16. The circuit board as recited in claim 15, the one or more cavities further comprising a bottom surface and a side surface, wherein the at least one internally conductive layer substantially prevents electromagnetic emissions from passing through the bottom of at least one of the one or more cavities, and wherein the second electrically conductive layer substantially prevents electromagnetic emissions from passing through the side of at least one of the one or more cavities.

17. A shielded electric circuit board, comprising:
    a planar substrate having a top and bottom surface, an edge, and one or more cavities extending from the top surface, the one or more cavities adapted to at least substantially enclose one or more electrical components, the one or more cavities further comprising one or more bond pads to electrically connect the one or more electrical components with the circuit board;
    at least one conductive ground layer internal to the substrate, at least a portion of the ground layer extending outward to the substrate edge; and an edge conductive layer on at least a portion of the substrate edge, the edge conductive layer electrically connected to the ground layer.

18. The shielded electric circuit board in accordance with claim 17, wherein the substrate includes at least one internal signal layer, said signal layer being co-planar with the internal ground layer and being electrically insulated from the ground layer and the external surfaces of said substrate.

19. The shielded electric circuit board as recited in claim 18, the one or more cavities further comprising a bottom surface and a side surface, wherein the at least one internally conductive layer substantially prevents electromagnetic emissions from passing through the bottom of at least one of the one or more cavities, and wherein the second electrically conductive layer substantially prevents electromagnetic emissions from passing through the side of at least one of the one or more cavities.

* * * * *